(12) United States Patent
Bachlechner et al.

(10) Patent No.: US 9,875,921 B2
(45) Date of Patent: Jan. 23, 2018

(54) FLEXIBLE PURGE MANAGEMENT SYSTEM (71) Applicant: Roth & Rau—Ortner GmbH, Dresden (DE)

(72) Inventors: Martin Bachlechner, Dresden (DE); Martin Peiter, Dresden (DE)

(73) Assignee: Fabmatics GmbH, Dresden (DE)

( * ) Notice: Subject to any disclaimer, the term of this patent is extended or adjusted under 35 U.S.C. 154(b) by 357 days.

(21) Appl. No.: 14/706,006

(22) Filed: May 7, 2015

(65) Prior Publication Data
US 2016/0329225 A1    Nov. 10, 2016

(51) Int. Cl.
*H01L 21/673* (2006.01)
*B08B 9/08* (2006.01)
*H01L 21/677* (2006.01)

(52) U.S. Cl.
CPC .... *H01L 21/67389* (2013.01); *H01L 21/6773* (2013.01); *H01L 21/67393* (2013.01); *H01L 21/67733* (2013.01); *H01L 21/67769* (2013.01)

(58) Field of Classification Search
CPC ......... H01L 21/67389; H01L 21/67393; H01L 21/6773; H01L 21/67733; H01L 21/67769
See application file for complete search history.

(56) References Cited

U.S. PATENT DOCUMENTS

| | | | | |
|---|---|---|---|---|
| 6,389,707 B1 * | 5/2002 | Peiter | ................ | H01L 21/67259 33/613 |
| 9,105,673 B2 * | 8/2015 | Babbs | ............... | H01L 21/67201 |
| 2005/0069420 A1 * | 3/2005 | Miyajima | ......... | H01L 21/67017 417/53 |
| 2007/0081879 A1 * | 4/2007 | Bonora | ............. | H01L 21/67727 414/217 |
| 2007/0144118 A1 * | 6/2007 | Alvarez, Jr. | ...... | H01L 21/67017 55/385.1 |
| 2008/0107506 A1 * | 5/2008 | Babbs | ............... | H01L 21/67772 414/217 |
| 2008/0156069 A1 * | 7/2008 | Murata | .................. | G01D 21/00 73/19.04 |
| 2010/0228378 A1 * | 9/2010 | Fukutomi | ......... | H01L 21/67766 700/112 |
| 2013/0343844 A1 * | 12/2013 | Fosnight | .............. | B65G 1/0464 414/281 |
| 2014/0112739 A1 * | 4/2014 | Hirano | .............. | H01L 21/67017 414/217.1 |
| 2015/0003942 A1 * | 1/2015 | Takahara | ............... | A47B 81/00 414/277 |

(Continued)

FOREIGN PATENT DOCUMENTS

DE    10 2013 222 900.3    5/2015

*Primary Examiner* — Marc Carlson
(74) *Attorney, Agent, or Firm* — Michael Soderman (57) ABSTRACT

The subject matter of this invention is a device for flexible purge management, comprising a FOUP transport system, a purging gas distribution system, one or more FOUP nests for holding FOUPs and an electronic control system. The overhead FOUP transport system, the gas distribution system and the electrical system run together for the most part. Adapter plates that serve to hold the FOUPs are arranged in the FOUP nests. A computer-supported multi-tier control system controls the device and makes it possible to individually address each FOUP nest and to also operate the remaining FOUP nests when there is partial removal.

9 Claims, 6 Drawing Sheets

(56) References Cited

U.S. PATENT DOCUMENTS

| | | | |
|---|---|---|---|
| 2015/0170939 A1* | 6/2015 | Rebstock | B08B 9/0321 |
| | | | 137/15.04 |
| 2015/0340260 A1* | 11/2015 | Pao | H01L 21/67748 |
| | | | 414/222.03 |
| 2016/0276189 A1* | 9/2016 | Igarashi | H01L 21/67775 |
| 2016/0358799 A1* | 12/2016 | Murata | H01L 21/67389 |
| 2017/0025297 A1* | 1/2017 | Kudo | H01L 21/67389 |
| 2017/0025298 A1* | 1/2017 | Iwamoto | B08B 5/00 |
| 2017/0133254 A1* | 5/2017 | Murata | H01L 21/67389 |

* cited by examiner

FLEXIBLE PURGE MANAGEMENT SYSTEM

BACKGROUND

The progressive development of the semiconductor industry towards smaller and smaller structural widths with growing wafer diameters leads to constant adjustments of the machine parks in the semiconductor factories.

Even when a wafer size is kept, machines (tools) in a semiconductor chip production line are replaced over and over again due to technical progress during the life cycle of a structural width. These new tools then mostly improve the production speed or reliability.

Modern chip production lines have throughput times of several months in part for a wafer. At the same time, there is a requirement for processing to be individually controllable right down to individual wafers. Furthermore, some wafers are to be treated in a preferential manner, whereas others have no particular urgency. These priorities can change. The wafer production (processing) is to be documented in a detailed fashion throughout the entire run so that the requirements of quality assurance can be fulfilled. In addition to the pure processing of the wafers, however, the conditions under which the wafers are stored between the individual processing steps are of central importance. Chemical and physical changes also take place in a quiescent state, especially to the wafer surface, depending on the environmental conditions. This leads to a situation in which the storage conditions are to also be defined and monitored.

A series of technical solutions have been developed to meet these diverse and partially divergent requirements.

In modern semiconductor production (chip production) factories, the wafers are put together into units (lots—usually 25 wafers) and moved in transport containers. Although these containers were frequently manually transported in older semiconductor factories (fabs) and the containers were simple plastic housings with drawers for the wafers, these designs no longer meet the current requirements. In the state of the art, the wafers are therefore transported and
stored in FOUPs (Front Opening Unified Pods). Drawers to hold the wafers are likewise found in these FOUPs. Moreover, however, a FOUP can be transported by machine. The front door is also opened and closed, and the wafers are removed and inserted, by machine.

Using the FOUPs, fully automated production lines are realized in which the FOUPs are automatically transported from one tool to the next, or from a tool to an intermediate storage area, or from that to a further tool. Defined storage conditions are to be created in the intermediate storage area that prevent, in particular, storage durations of different lengths from leading to different surface characteristics of the wafers. Purging the surfaces of the wafers with inert gases has therefore proven to be advantageous to push oxygen out of the FOUPs and thus prevent oxidation and diffusion processes or to at least to strongly limit them. Argon or nitrogen is used as a suitable purging gas. The locations of the FOUPs in intermediate storage areas that are attached to the ceiling of the clean room are called FOUP nests. FOUP nests are understood below to mean all of the locations of FOUPs that serve to provide intermediate storage or to purge the wafers with purging gases without being part of a tool. Thus, FOUP nests do not necessarily have to hang from the ceiling of the clean room.

The FOUPs are transported by their own transport devices. They are usually realized in the form of rail systems on which the FOUP grippers move. An example is described in US 2010/0228378 A1. The rail system is designed as OHT (overhead hoist transport). The rails are arranged here above the tools and the traffic paths in the clean room. Technical solutions are known, however, that provide for transport systems installed on the floor of the clean room. The FOUPs are raised and lowered via cable-borne FOUP grippers in US 2010/0228378 A1.

The FOUPs are unloaded in the load ports of the tools, the wafers are fed into the processing and, after that, the FOUPs are loaded again. The wafers are not processed in the FOUP nests of the intermediate storage area or areas, but are instead merely flushed with inert gas. This flushing is called purging. The intermediate storage areas are frequently designed to be FOUP nests hanging down from the ceiling of the clean room on struts. When the FOUPs are put down in the FOUP nests, they are set on base plates that have guide pins (kinematic coupling pins) and gas connections. These gas connections engage in a positive-locking and sealing manner with corresponding counterparts in the floors of the FOUPs. The supply of gas is made possible in that way. The gas supply system can likewise be installed overhead or, because clean—room floors are usually perforated double floors, in the intermediate area between the perforated floor and the lower floor of the clean room.

The designs of the FOUPs, their base plates and the FOUP nests vary depending on the manufacturer.

In the state of the art, the purging process is frequently controlled via a central computer that, as a drawback, can only address groups of FOUP nests in a number of embodiments. The gas flow is enabled even when not all of the FOUP nests of an intermediate storage area are occupied, which can lead to an escape of inert gas (which is harmless in technical or health-related terms due to the very high rate of air exchange in the clean room). The gas consumption increases significantly because of that, however.

As explained, the tools of the semiconductor industry are frequently replaced in the clean rooms. These machines are usually special designs with substantial dimensions, so transport in or out is problematic. In particular, it is not only necessary to disconnect all of the resource lines (electrical energy, possibly water, various gases); the corresponding supply systems have to likewise be removed. This also applies in an analogous fashion to the FOUP transport systems or the FOUP intermediate storage areas. They have to likewise frequently be removed to create working space. The situation intensifies when transport systems installed close to the floor are involved. The newly installed tools also include FOUP nests under certain circumstances that do not match the ones previously used in terms of the positions of the connections of the base plates.

SUMMARY

The subject matter of this invention is a device for flexible purge management, comprising a FOUP transport system, a purging gas distribution system, one or
more FOUP nests for holding FOUPs and an electronic control system. The overhead FOUP transport system, the gas distribution system and the electrical system run together for the most part. Adapter plates that serve to hold the FOUPs are arranged in the FOUP nests. A computer-supported multi-tier control system controls the device and makes it possible to individually address each FOUP nest and to also operate the remaining FOUP nests when there is partial removal.

DETAILED DESCRIPTION

The task consequently arises to suggest a flexible system for the effective purging of FOUP containers that is easy to adapt, easy to remove and individually controllable.

The problem is solved as per the invention with a device according to claim 1. Advantageous embodiments are disclosed in the dependent sub-claims.

The device as per the invention has a FOUP transport system, a purging gas distribution system, one or more FOUP nests and an electronic control system.

The FOUP transport system is designed, as per the invention, in the form of an OHT and thus an overhead system. It has FOUP transporters with FOUP gripping devices as per the state of the art. As a preference, the rail sections of the OHT system are designed in the form of prefabricated modules that can be released from a suspension unit of the transport system independently of one another.

The gas distribution system and optional gas collection system run in parallel with the transport system as a preference and are integrated into it as a very special preference. In an especially preferred embodiment, the gas supply feed and/or the optional gas discharge outlet of the gas distribution system are integrated into the rail or the rails of the OHT system.

Cable systems, chain hoist systems or rigid guide rails, preferably running in a vertical fashion, are suitable for lowering the FOUP grippers from the FOUP transporters running overhead into the FOUP nests. In accordance with the
invention, the gas supply feed is directly parallel to the supply feeds for the FOUP nests. In a preferred embodiment, the gas supply feed is consolidated into a gas supply line and optionally a gas discharge line for several FOUP nests. As a special preference, the two lines run directly next to each other. In a further preferred embodiment, the gas supply line and optionally the gas discharge line are directly adjacent to or in guide rails for the FOUP grippers. In an especially preferred embodiment, the gas supply line, optionally the gas discharge line and the guide rail are designed in the form of a module that can be jointly removed. As another preference, the gas supply lines and/or discharge lines and electrical and signal lines are fastened in a detachable way to suspension units of the FOUP nests or integrated into them.

The FOUP nests of one or more intermediate storage areas can also be advantageously adapted to the FOUPs that are already being used when there are newly installed devices for the intermediate storage area. Adapter plates are provided as per the invention for this purpose that are set down on the existing guide pins in the FOUP nests and create an adaptation to the base plates of the FOUPs. The adapter plates preferably have a low overall height. The overall height is preferably less than 32 mm, less than 20 mm as a special preference and less than 16 mm as a very special preference. The overall height is calculated here from the flat top of the adapter plate (without guide pins etc.) to the bottom of all of the devices arranged on the bottom of the adapter plate (pressure switch, particle filter etc.). The shape of the adapter plate is preferably chosen in such a way that all of the guide pins and gas connections are reached from a joint adapter plate. This is possible, as a preference, via a triangular, V-shaped or Y-shaped design. Multi-part adapter plates (for instance those that are symmetrically divided in two) or plates over the whole area (square or rectangular) are also possible, however. The material for the adapter plates has to be suitable for a clean room and is preferably selected from suitable metals (stainless steel, aluminum) or plastic. Anodized aluminum is especially preferred. In a preferred embodiment, the adapter is made of plastic. An advantageous further development envisages here that the hose connection sections have clamping parts for hoses or tubes or parts of the gas routing system integrated (preferably cast) into the adapter plate. In a further preferred embodiment, further parts of the devices arranged on the bottom of the adapter plate are cast in.

The top of the adapter plate has guide pins that fit into the openings in the FOUPs provided for them. This leads to a defined positioning of the FOUPs on the adapter plates. Furthermore, gas supply line adapters and optionally gas discharge line adapters are provided that create a sealing connection towards the clean room with the corresponding gas supply line connections and optional gas discharge line connections of the FOUPs when a FOUP is set down. The gas supply line adapters or gas discharge line adapters are preferably made of a flexible and elastic material. A very special preference here is nitrile rubber, which can preferably be provided with a nano-particle seal.

Holders for the guide pins of the original FOUP nests are provided on the bottom of the adapter plates. Moreover, optional connections exist to the gas connections (supply feed and optional discharge outlet) of the original FOUP nests. The gas supply lines of the adapter plate are equipped with two pressure sensors. Two threshold value sensors are preferably used for this; the first pressure sensor responds when pressure falls short of a minimum pressure, and the second pressure sensor responds when a maximum pressure is exceeded. In a further preferred embodiment, only one pressure sensor is used that is designed in the form of a threshold value sensor with an upper threshold and a lower threshold.

The adapter plate has, moreover, a free/occupied sensor that is preferably no-contact and that detects the existence of a FOUP on the adapter plate. Suitable sensors are known in the prior art based on an infrared or laser basis. A microswitch that is pressed by the FOUP that is set down can already be used as a simple mechanical solution.

It is important for the invention that at least one particle filter that is suitable for a clean room, which filters out the impurities that exist in the gas system before entering the FOUP, is provided in the gas inflow of the adapter plate. If several gas inlets into the FOUP are provided, several particle filters, at least one before a gas inlet in each case, are possible. The particle filter is preferably arranged behind the pressure sensor(s), viewed in the direction of gas flow. It is also possible, however, to position it in front of the pressure sensors. The particle filter is known in the prior art and makes it possible to hold back particles in accordance with the existing clean room class. The gas routing systems underneath the adapter plates are preferably realized via suitable hoses. Furthermore, a gas routing system with stainless steel lines is preferred.

As an option, the adapter plates can have a discharge outlet for purging gas. It extracts the inert gas introduced into the respective FOUP at specified points. The advantage of an arrangement of that type is that the gas flows in a defined manner in the FOUPs. In a further preferred embodiment, a gas discharge outlet from the FOUP is not provided. The inert gas that is supplied preferably exits through the outlet interface on the FOUP, but also through leaks in the front door, into the clean room atmosphere. That is not critical, however, because the gas (nitrogen, argon) is harmless both in a health sense and in a technical sense because of the very high rate of air exchange in the clean room.

Furthermore, it is free of particles to an adequate degree because of the particle filter in the gas supply line.

The purging process is controlled via a multi-layer (multi-level) hardware architecture.

Every adapter plate provides information about the free/occupied status and the possible overshooting or undershooting of the intended pressure of the inert gas of the FOUP next in which it is installed at a next controller (purge group controller). A purge group controller controls the adapter plates of several, preferably up to six, FOUP nests. More or fewer controlled nests are also possible, however.

The free/occupied information and the information of the pressure sensors are transmitted to the purge group controller. That is preferably done in a wire-bound fashion. Connections based on glass fibers or wireless connections are also conceivable, however. In the case of a physical connection (wire, glass fiber) between the adapter plate and the purge group controller, the connection line will preferably run in parallel with the gas supply and optional gas discharge lines and with the vertical supply lines of the OHT system to the FOUP nests.

In an especially preferred embodiment, the gas routing systems, the signal connections and the vertical supply feeds of the OHT system are put together into one module that can preferably be easily mounted and removed in one piece.

The signals of the sensors of the adapter plates in the FOUP nests are collected
and processed by the purge group controller. The purge group controller has an inert-gas supply feed. It is internally divided up into individual supply feeds for the FOUP nests controlled by the purge group controller. The purge group controller has, for each FOUP nest or more precisely for the adapter plate of each purge nest that it controls, a gas supply valve that is open when there is an occupied signal and closed when there is a free signal. If a pressure sensor reports that the permissible pressure in the gas supply line of the adapter plate of a purge nest is overshot or undershot, the gas supply will likewise be blocked by closing the gas supply valve.

Moreover, the purge group controller has as a special preference exactly one input for the signal cable of each adapter plate controlled by it (each controlled FOUP nest). The signal cable preferably combines in itself all of the electrical power, data and signal lines of each adapter plate. In a further preferred embodiment, the electrical power, data and signal lines are routed in individual or only partially integrated cables and the purge group controller has a corresponding number of inputs for these cables for each FOUP nest. The multiple cables are then preferably connected to one another in a detachable fashion (for instance with cable ties). In a further preferred embodiment, the signal connections for FOUP nests arranged next to one another are serial and the signals are transmitted over common lines according to the state of the art (for instance via time-multiplexing processes or a CAN bus). If processes of that type are used, each adapter plate will additionally have one or more corresponding controller chips that can also be integrated into the pressure sensors or into the free/occupied sensor. Furthermore, when there is wiring of this type, the serial input and output cables are to be directly connected to one another if an adapter plate is removed from the chain.

The purge group controller has a corresponding adapter unit that is suitable for accepting the signals of the pressure sensors and the free/occupied sensors of the connected adapter plates, adapting them and feeding them to an interface unit of the purge group controller. The adapter unit can be integrated into the interface unit. As a preference, the adapter unit will convert the signals into values that the interface unit can digitalize. The interface unit will preferably operate as an input/output module for a CAN BUS network (CAN—controller area network). Other bus systems from the state of the art are also suitable.

The purge group controller is preferably accommodated as an independent unit in a housing. This housing preferably has a gas-tight design to prevent the leakage of contamination from its interior. In a further preferred embodiment, the housing has ventilation holes that are provided with cleanroom filters. Pressure compensation is advantageously possible in that way without contaminating the clean room. Moreover, force ventilation of the housing can be realized if necessary to prevent an accumulation of heat in the interior. As a preference, the housing has display possibilities for transmitting information on the status of the purge group controller itself, as well as the statuses of the adapter plates of the FOUP nests or purge process. In a simple embodiment, one or two status lights (LEDs) are provided that have different illumination states depending on the sensor data. Thus, the operator can easily determine whether the purge group controller or the purge nest group controlled by it is operating in an error-free manner.

Advanced embodiments optionally provide visual indicators for the purge group controller itself and separate indicators for the status of each FOUP nest. Advanced display possibilities such as screens etc. are also possible, of course.

The purge group controller passes along data on the FOUP nests connected to it to the purge bay controller. A purge bay controller controls several purge group controllers, preferably 2 to 32, with a special preference for 8 to 24 and a very special preference for 15. On a technical basis, however, the use of merely one purge group controller to a purge bay controller is also possible, but it should be considered with regard to cost aspects.

Each purge group controller will have at least one possibility for transmitting data to a purge bay controller. This data transmission is comprised of free/occupied information of the FOUP nests and the forwarding of the pressure sensor data.

The supply line for inert gas also runs through the purge bay controller. The flow of gas is adjusted here via a pressure regulator, a pressure gauge and a flow meter down to the desired pressure, and the continuous flow is monitored. The data from the pressure regulator and the flow meter is processed for a controller unit through an interface unit. This controller unit controls, among other things, the
pressure regulator in dependence upon the values of the flow meter. After exiting the flow meter, the inert-gas line is routed to the purge group controllers; the line has branches for each individual purge group controller. In another preferred embodiment, the inert—gas line is routed through (looped through) all of the connected purge group controllers. The pressure that is to prevail in the inert-gas line is determined in a preferred embodiment by the controller unit, taking the currently connected number of FOUPs that are in a purging process into consideration. As soon as a further FOUP is set down in a FOUP nest and is ready for purging, the controller unit determines the new values for the flow meter and the pressure regulator and issues the appropriate signals through the interface unit. The other way around, the gas flow is reduced when a free message arrives for a FOUP nest that was previously occupied. Signals of the pressure sensors can also be given consideration in that way. Pressure variations in the inert-gas system are kept to a minimum in that fashion, because there is already a proactive reaction to the change in the number of FOUPs in the purge process and the varying gas requirements.

In a further preferred embodiment, the gas flow is not proactively changed and only the pressure fluctuation arising as a result of the changed number of FOUPs to be purged is subsequently adjusted.

The controller unit also further processes the messages of the purge group controllers. The controller decides on the reaction to signals of the purge group controllers in accordance with its programming. In particular, the pressure overshoot or undershoot signals are evaluated and converted into response signals for the corresponding purge group controller that accordingly interrupt the gas flow.

The free/occupied signals of the purge group controllers are included in the evaluation of the pressure sensor signals.

Each purge bay controller supplies electrical power to the purge group controllers connected to it. It has a corresponding power supply unit for that. The energy is preferably supplied through the same lines that are also used to send the control signals to the purge group controllers. Separate line routes are also possible, however.

Each purge bay controller is accommodated in a housing. In an analogous fashion to the purge group controllers, these housings can likewise have visual display means and ventilation openings (protected by a clean—room filter). Each purge bay controller controls at least one, but preferably several (up to 16 or 17), purge group controllers. More purge group controllers are also theoretically possible. The quantity is to be taken into consideration in the design of the gas supply lines and the electrical supplies.

The purge bay controllers deliver the data to a purge manager host through the purge group controllers connected with it and their FOUP nests. The data connection is preferably realized through a customary Ethernet or a CAN bus. Wireless data transmissions are also possible, however. The data is either queried at regular intervals by the purge manager host (pull mode) or reported by the purge bay controller to the purge manager host (push mode). The data can be reported at regular intervals (synchronous push) or, when there is a change in the nest occupancy or when events arise (response of pressure sensors), as an asynchronous push. The purge manager host is preferably designed as a commercially available PC or server and also performs logging (log files) and data processing in addition to the task of data collection. A graphical representation of the states of the FOUP nests with the FOUPs contained in them, the purge group controllers and the purge bay controllers can be provided in the course of the data processing. Events (pressure sensor signals, free/occupied changes) can be followed there. The corresponding human operator can intervene in the automatic control and overrule the reactions to pressure sensor signals or free/occupied signals. The purge process can be continued, for instance, when the pressure sensor has displayed an overshoot or undershoot of the pressure. A continuation of the purging can be useful, however, if it is known that the door of the corresponding FOUP is very leaky. Furthermore, FOUP nests that are displayed as being free can be supplied with nitrogen. That can be useful for cleaning or testing purposes. Moreover, a certain amount of after-run time of the nitrogen supply to a FOUP nest that has become free can be useful. Since the purge manager host is to be viewed as a freely programmable data-processing facility, adapted control programs can react to events and the control programs can also be adapted to changing requirements. Furthermore, it is intended that the controller units of the purge bay controllers can be supplied with updated firmware or programs via the purge manager host.

The device as per the invention is suitable both for FOUPs for 300 mm wafers and for FOUPs for 450 mm wafers.

BRIEF DESCRIPTION OF THE DRAWINGS

The following design example is intended to explain the device as per the invention in more detail without being limiting, however.

The FOUPs (1) are set down on adapter plates (2). The gas flow (11) runs through inlets in the adapter plates (2) and the FOUPs (1). The monitoring of the pressure of the gas flow (11) is symbolized by the pressure gauge (21).

The FOUP-nest adapter plate that is shown is designed for use with two different FOUP designs. Depending on the design, one of the two gas supply-line adapters (214, 215) will fit into the gas inlet of the FOUP. The adapter plate is adapted before use by attaching the appropriate hose guides to the FOUP design used in the clean room. The gas supply-line adapter that is not used is not supplied with purging gas and remains unused.

The hoses that connect the individual components to one another were not shown in FIG. 3 due to clarity reasons. The hose that supplies the inert gas coming from the purge group controller (PGC) is connected to the clean-room filter (23). A hose is routed from this filter to the first Y connector (219). One branch of the Y connector leads through the connector (218) to the pressure sensors (211, 212), whereas the other branch leads to the gas supply-line adapter (214). The gas discharge-line adapter (215) and the Y connector (217) remain unused and are also not connected via hoses.

DETAILED DESCRIPTION OF THE PREFERRED EMBODIMENTS

Design Example 1—Normal Operation

Figure 1:
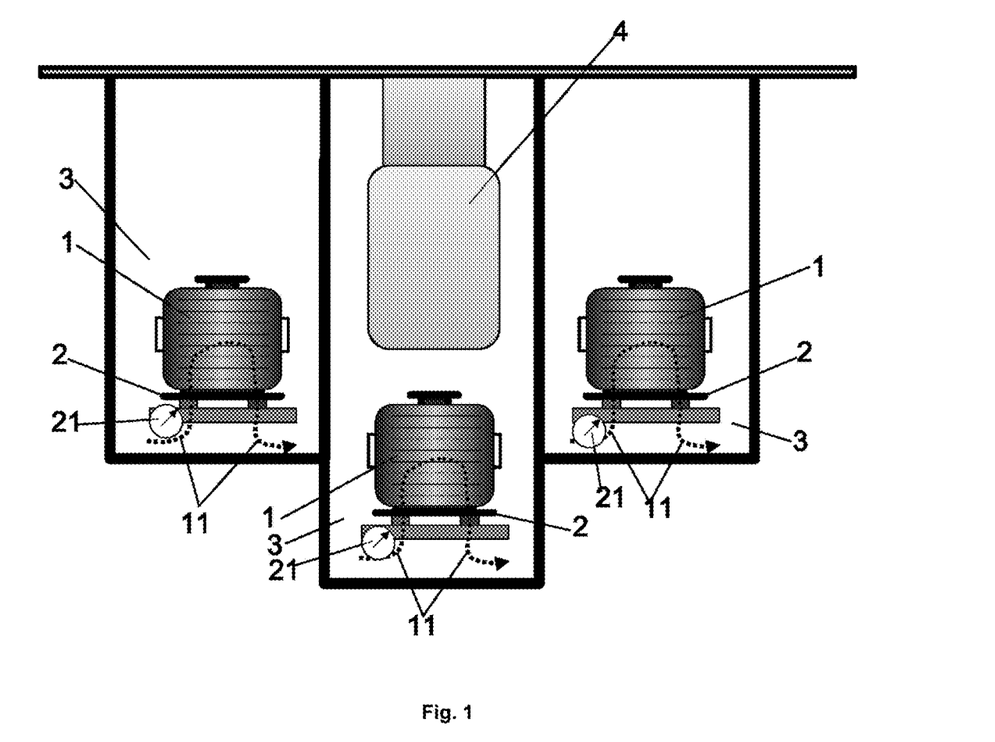
FIG. 1 shows a schematic diagram of the arrangement of three FOUP nests (3) relative to the overhead transport system (OHT) (4). The OHT (4) is shown in a sectional view here, and it is consequently perpendicular to the drawing plane.

FIG. 1 shows a schematic diagram of a solution for a purge system. The FOUP nests (3) are, just like the overhead transport system (OHT) (4), designed to be suspended from the ceiling. They are arranged within reach of the FOUP grippers in the process. The FOUP gripper is designed to be a gripping arm here that can also handle lateral FOUP nests (3). The FOUPs (1) are presented standing on adapter plates (2) in the FOUP nests (3). The FOUPs contain 300 mm wafers. The inert-gas flow (11), N2 here, leads through the adapter plate (2) into the FOUP (1) in the process. After the purging, the inert gas flows into the clean room through the gas inlet of the FOUP that is not connected to a gas supply-line adapter. The pressure monitoring (21) is suggested in a schematic fashion in the process. This OHT system (4) involves a system of the company Murata. The FOUP grippers operate here as automatic gripper arms as, for instance, described in US 2007/0081879 A1. The inert gas is routed in pipelines (not shown) that are laid close to the ceiling and directly on the ceiling of the clean room here. The individual FOUP nests (3) are supplied with inert gas through branch lines (not shown) that are laid perpendicularly from above on the suspension units of the FOUP nests (3).

Figure 2:
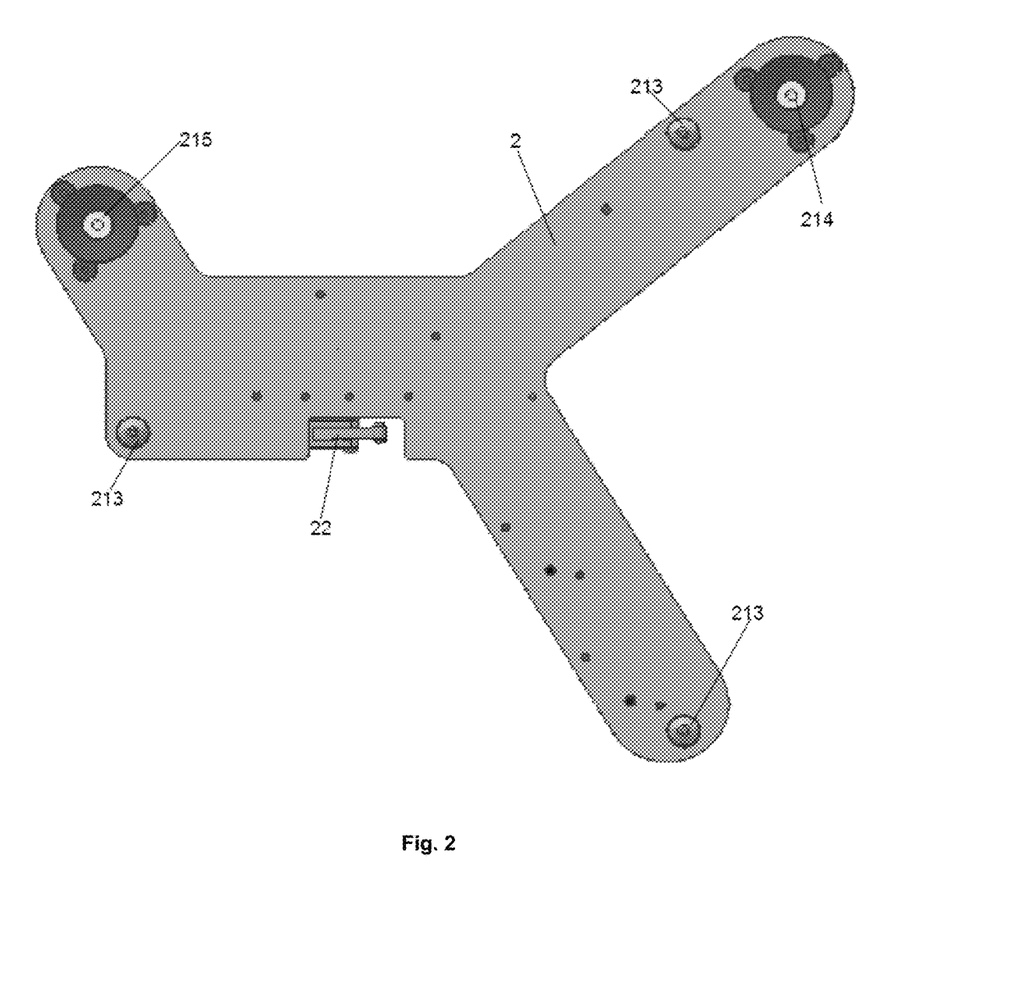
FIG. 2 shows the top of the FOUP-nest adapter plate.
Figure 3:
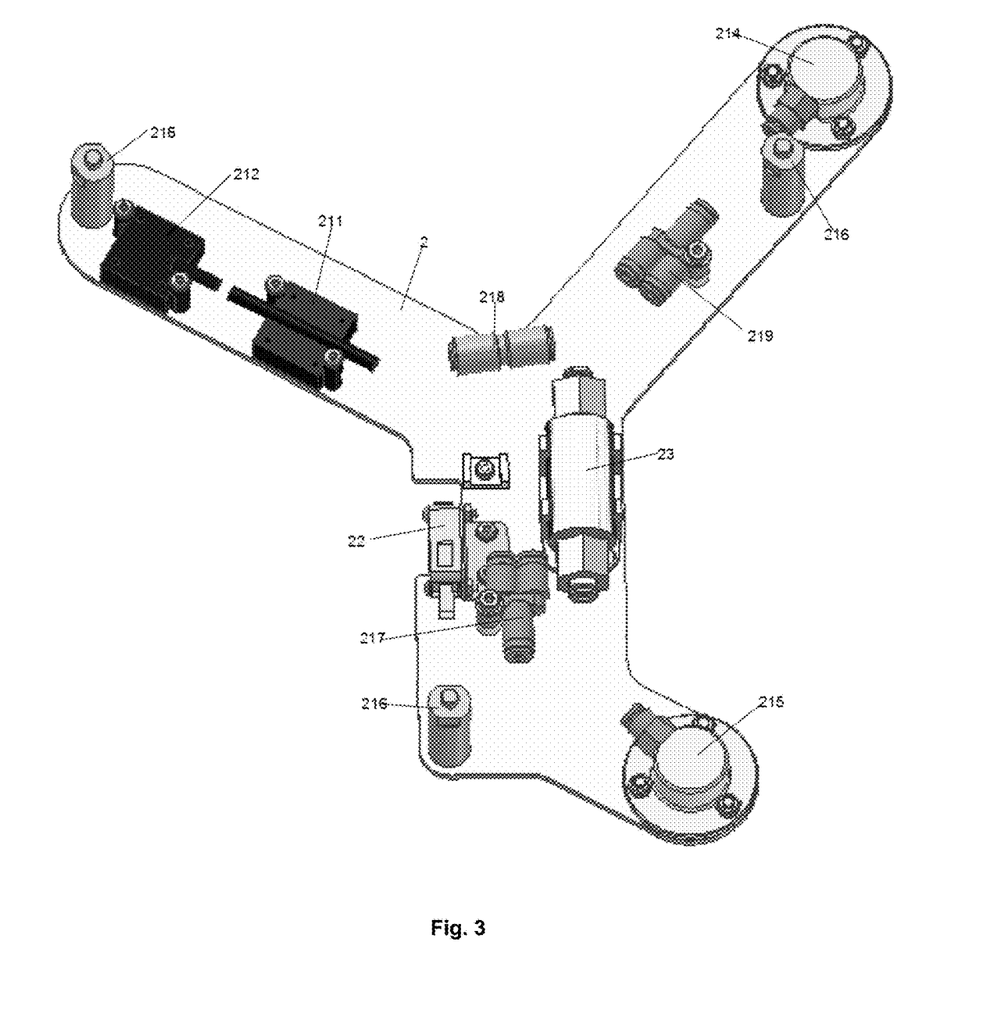
FIG. 3 shows the bottom of the FOUP-nest adapter plate.
Figure 4:
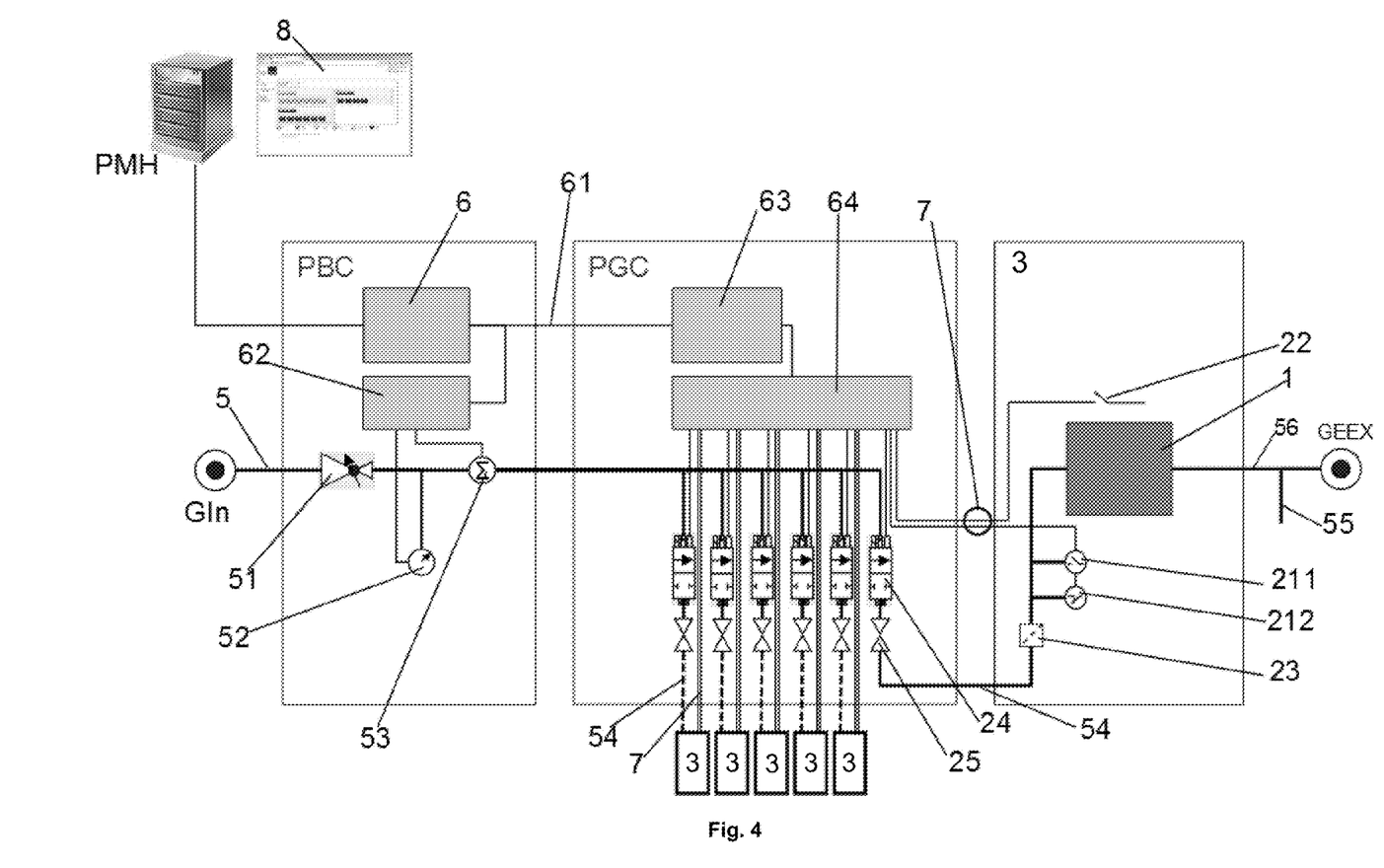
FIG. 4 (basic diagram) shows a schematic diagram of the fundamental structure of the purge management system as per the invention.

The FOUPs (1) in the FOUP nests (3) are arranged on adapter plates (2). The FOUPs (1) have openings at the bottom for the guide pins (213). These guide pins (213) bring about restricted guidance of the FOUP (1) when it is set down on the adapter plate (2). It is ensured in that way that the gas inlet of the FOUP (1) will be sent down in a direct and sealing way on the gas supply-line adapter (214). The free/occupied sensor (22) responds as soon as a FOUP (1) has been completely set down on the adapter plate (2) and transmits an "occupied" signal to the purge group controller (PGC). The signal connection of the free/occupied sensor (22) is realized in the form of a physical line. It runs together with the signal lines of the pressure sensors (211, 212) in a multi-wire line.

Figure 6:
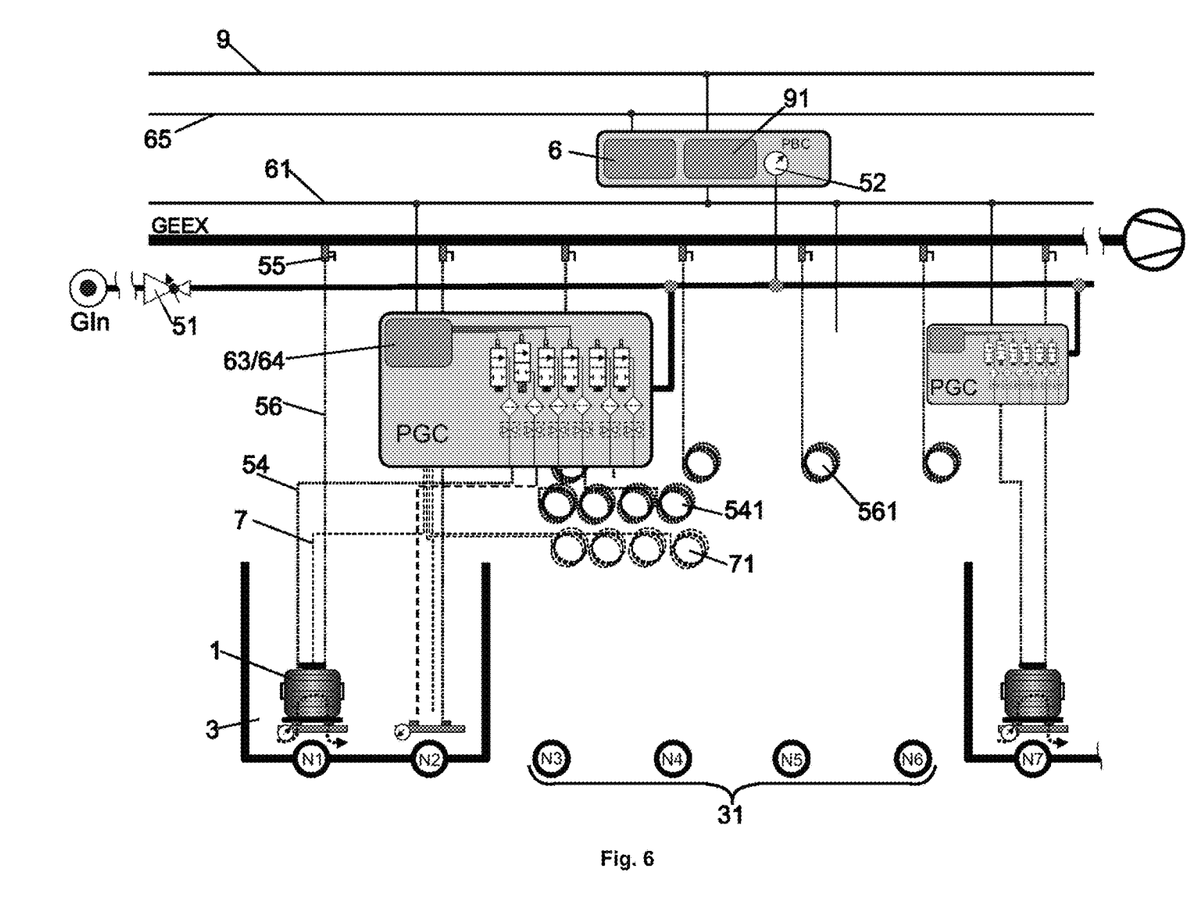
FIG. 6 (Config_B) shows a schematic diagram of the state of the device as per the invention in the case of a partial removal of the FOUP nests.

The purge group controller (PGC) receives the signal of the free/occupied sensor (22) in the adapter module (64) (see FIG. 6). The signal for the downstream CAN-IO-24 module (63) is adapted here and passed along to it. The signal is passed along to the purge bay controller (PBC) through the CAN bus (61) from the CAN-IO-24 module (63) of the purge group controller (PGC). The CAN controller (6) of the purge bay controller (PBC) processes the signal. As a result, a signal is generated that is sent back to the purge group controller (PGC). This signal is received in the CAN-IO module (63) of the PGC and passed along to the CAN-IO adapter (64), which converts it into the required voltage to open the valve (24) for the gas flow through the gas supply line (54) of the FOUP nest (3) in which the FOUP (1) was set down. The CAN controller (6) of the purge bay controller (PBC) simultaneously generates another signal along with the described signal. It is generated using the measured values of the flow meter (53) and the pressure gauge (52) and serves to further open the pressure reduction valve (51) to give consideration to increased purging-gas requirements (inert gas N2) because of the FOUP (1) to be additionally purged. This is sent to the CAN-AD converter (62) of the purge bay controller (PBC), which realizes the change in voltage required to control the pressure reduction valve (51). The increased inert-gas requirement is therefore taken into account as close in time as possible to the start of the purge. This advantageously prevents pressure fluctuations in the purge system.

The change in state in the FOUP nest (3) is passed along to the purge management host (PMH). Since an event of normal operation is involved, an entry is merely made in the databases maintained by the host (PMH) and in the log files, and the graphical presentation (8) in the operator terminal is updated.

The pressure sensors (211, 212) could respond, for instance, when the clean-room filter (23) of the adapter plate (2) clogs up after a long period of operation
and the pressure loss becomes too large. The low pressure sensor (211) can respond when there are leaks in the system, for instance when the FOUP (1) is not correctly seated on the adapter plate (2) or the gas supply-line adapter (214) is damaged and does not provide a proper seal.

The signals of the pressure sensors (211, 212) are transmitted through the purge group controller (PGC) to the purge bay controller (PBC) in a manner analogous to the signals of the free/occupied sensor (22). The purge bay controller (PBC) generates signals to block the gas supply that are sent to the purge group controller (PGC) and that lead to the closing of the valve (24) there. The purge group controller (PGC) switches its visual state display to rad so that it is easier for the maintenance personnel to find the purge group controller (PGC) that the problematic FOUP nest (3) is connected to. Furthermore, the gas flow in the purge bay controller (PBC) is adapted to the reduced requirements via the pressure reduction valve (51). A message is sent to the purge management host (PMH). It makes an entry in the databases maintained by the host (PMH) and in the log files. Moreover, an emphasized display is provided in the graphical representation (8) in the operator terminal. The purge management host (PMH) obtains information from the fabrication system (the "workflow" production management system here) about the priority of the wafers in the relevant FOUP (3). When wafers with an increased priority in terms of the throughput time or unique wafers (test wafers) are involved, an acoustic alarm will additionally be triggered and/or electronic alarm messages will be transmitted (e-mails, pagers etc.).

Design Example 2—Operation During Conversion Measures

Figure 5:
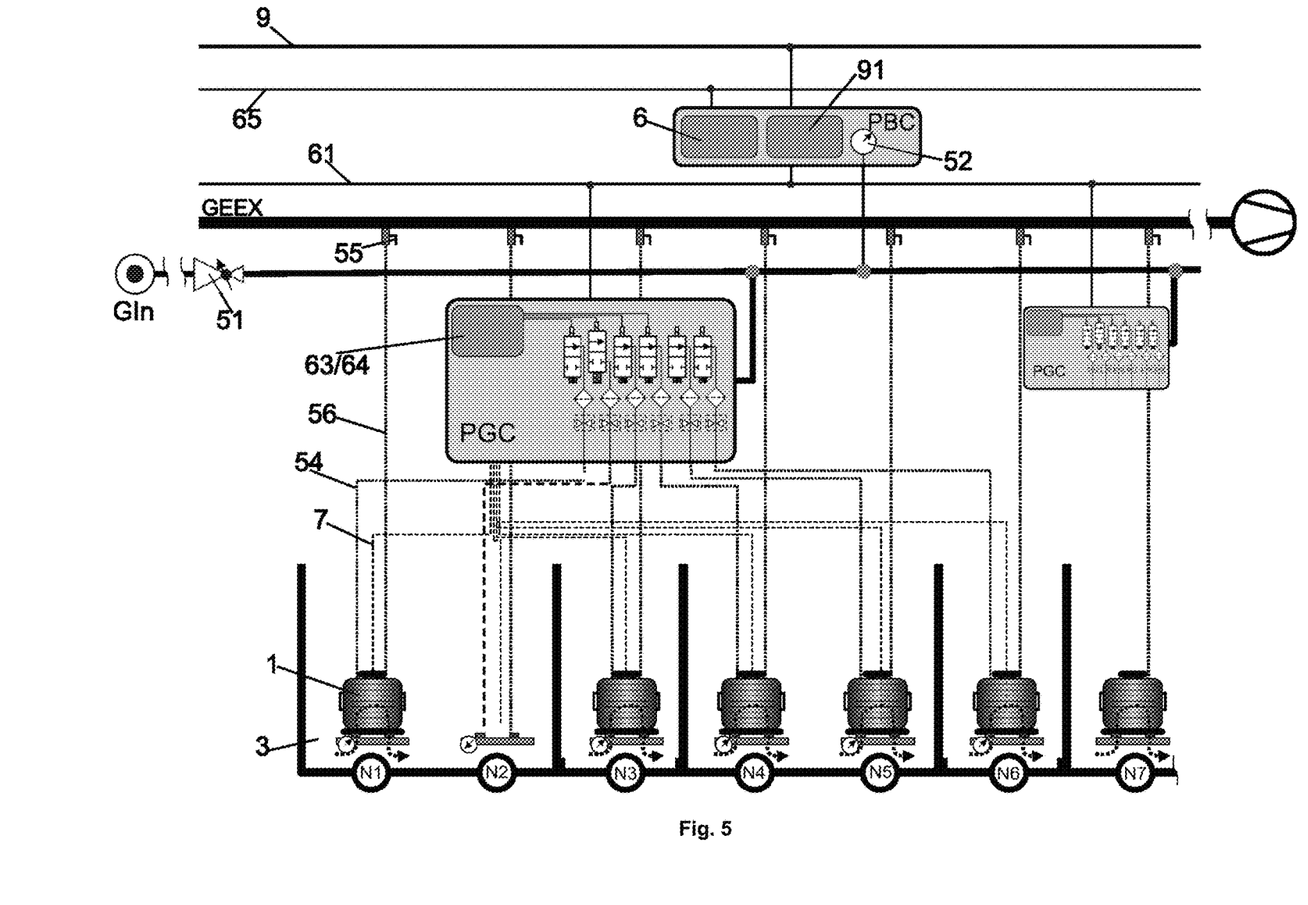
FIG. 5 shows a schematic diagram of the state of the device as per the invention in normal operation.

FIG. 5 shows the device as per the invention during normal operation, where all of the FOUP nests (3) can be used without any problems. Alarm messages here merely relate to deviations with respect to pressure measurements in the FOUP nests (3). The gas discharge lines (56 and GEEX) that are shown are optional and are not realized in this design example.

FIG. 6 shows a schematic diagram of the state of the device as per the invention if a portion of the FOUP nests (3) have to be removed. The gas discharge lines (56 and GEEX) that are shown are optional and are not realized in this design example. The FOUP nests (3) N3 to N6 had to be removed within the
framework of the tool changes in the clean room. These four FOUP nests (3) are assigned to a common purge group controller (PGC) that should continue to use the other two FOUP nests (3) N1 and N2 that did not have to be removed. The FOUP nests (3) N3 to N6 are emptied via the separate control unit of the OHT, and the FOUPs (1) that may be in them are moved to other FOUP nests (3). These FOUP nests (3) are tagged as non-usable for the duration of the conversion measures in the control unit of the OHT. In preparation for removal, the operator arranged for the shutdown of the FOUP nests (3) N3 to N6 in the purge management host (PMH). The corresponding entry was transmitted from the purge management host (PMH) to the purge bay controller (PBC). The purge bay controller arranged for the closing of the four valves (24) of the gas supply line of the FOUP nests (3) N3 to N6. The overall gas flow was likewise reduced by the purge bay controller (PBC) in the manner described above (as in the case of the shutdown entry regarding an individual FOUP, only for a larger volume flow).

The physical removal of the FOUP nests (3) N3 to N6 and their supply lines (7) is now possible. The electrical supply lines (7) and the inert-gas supply line (54) run along the ceiling of the clean room in parallel with the OHT and along a suspension strut of the FOUP nest (3) from the ceiling down to the FOUP nest (3). The electrical and gas lines (7, 54, 56) are fastened in a detachable way to the strut (plastic collars). The electrical connections of the supply lines (7) to the adapter plates (2) are designed to be detachable (threaded plugs or bayonet-catch connectors). They can accordingly be pulled off, and the supply lines (7) can be wound up and hung on the ceiling of the clean room. Each inert-gas supply line (54) is provided with a shutoff valve that is directly arranged behind the branching of the inert-gas supply line (54) in the form of a branch line. The inert-gas lines (designed to be hoses here) (54) are fastened in a detachable way there. The connection of the gas line (54, 56) to the adapter plate (2) is also detachable. The hoses of the gas supply line (54) are likewise pulled off at the adapter plate (2), rolled up and temporarily suspended from the ceiling. The mechanical removal of the FOUP nest (3) follows that. It is fastened to the ceiling via four suspension units and can be easily removed by undoing the screw connections.

Since each FOUP nest (3) has a separate gas supply line (54) and separate electronic and electrical supply lines (7), the two FOUP nests (3) N1 and N2 remaining within the sphere of management of the purge group controller (PGC) are operated further without any problems. The design does not have any bus-type connections that would run in the area of the FOUP nests (3). This design form and the variable removal and mounting make it possible to also put the removed FOUP nests (3) into operation again independently of one another.

LIST OF REFERENCE NUMERALS

1 FOUP
11 Gas flow through the FOUP
2 Adapter plate
21 Pressure sensors of the adapter plate
211 Low pressure sensor
212 Excess pressure sensor
213 Guide pins
214 Gas supply-line adapter
215 Unused gas supply-line adapter
216 Support pins of the adapter plate
217 Y-hose connector
218 Hose connector
219 Y-hose connector
22 Free/occupied sensor
23 Filter
24 Valve
25 Flow limiter
3 FOUP nest
31 Removed FOUP nests
4 Overhead transport system (OHT)
5 Gas supply line
51 Pressure reduction valve
52 Pressure sensor
53 Flow meter
54 Gas supply line to an individual FOUP nest
541 Temporarily shutdown gas supply line
55 Bypass
56 Optional gas discharge line from an individual FOUP nest
561 Temporarily shutdown gas discharge line
6 CAN controller
61 CAN bus
62 CAN A/D converter
63 CAN-IO-24 module
64 CAN 10 adapter 24
65 Ethernet connection
7 Electrical supply lines/signals to the FOUP nests
71 Temporarily shutdown electrical supply lines/signal lines
8 Summary presentation of the states of the FOUPs
9 Electrical power supply
91 Voltage converter 230 V alternating current to 24 V direct current
GEEX Gas discharge outlet
Gin Gas supply feed
N1 . . . N7 FOUP nest 1 to FOUP nest 7
PBC Purge bay controller
PGC Purge group controller

The invention claimed is:

1. Device for flexible purge management, comprising a Front Opening Unified Pod (FOUP) transport system (4), a purging gas distribution system, one or more FOUP nests (3) for holding FOUPs (1) and an electronic control system, characterized in that
the FOUP transport system (4) has overhead transport rails and FOUP gripping devices with guide rails, wherein the purging gas distribution system has gas supply lines (5, 54) and the electronic control system has electrical lines (7) that likewise run overhead and in parallel with the transport rails, wherein the gas supply lines (5, 54, 56) and the electrical lines follow the guide rails of the FOUP gripping devices or suspension units of the FOUP nests (3) or are integrated into them,
adapter plates (2) with a low overall height of less than 32 mm are arranged in the FOUP nests (3) that
are configured to mechanically and fluidly connect to the FOUP,
have a free/occupied sensor (22),
have pressure sensors (211, 212) in the gas supply lines (54) in the form of threshold-value switches for sensing excess and low pressure,
have clean-room filters (23) in front of every gas inlet (214) into each FOUP (1),
the electronic control system is a computer-supported multi-tier control system, comprising:
a) exactly one purge manager host that is controlled by a program of the purge manager host and/or operator,
b) one or more purge bay controllers (PBC)—controlled by a program of the purge bay controllers and/or controlled by a)
c) one or more purge group controllers (PGC)—controlled by b),
d) one or more FOUP nests (3)—individually controlled by c),
wherein b) delivers an overall gas flow to c) and c) delivers control signals for the gas flow (11) to d), whereas d) exclusively transmits nest free/occupied information and excess and low pressure alarms to c).

2. Device according to claim 1, characterized in that the gas supply lines (54) and the electrical lines (7) individually run for each FOUP nest (3) from one purge group controller (PGC) to a FOUP nest (3).

3. Device according to claim 1, characterized in that the device has a gas extraction unit (GEEX) that runs as a common extraction line in parallel with a transport device with branches (56) to the FOUP nests (3) that can be shut off, wherein the branches (56) run in parallel with the gas supply lines (54).

4. Device according to claim 1, characterized in that the adapter plates (2) have two pressure sensors (211, 212) that act as threshold value switches for sensing excess pressure and low pressure or that the adapter plate (2) has a pressure sensor that is designed to be a common threshold value sensor switch for sensing excess pressure and low pressure.

5. Device according to claim 1, characterized in that the purge group controller (PGC) has, for each FOUP nest (3) that it controls, a shutoff valve to release/shut off the gas flow (54).

6. Device according to claim 1, characterized in that the electronic control system between the purge bay controller (PBC) and the assigned purge group controllers (PGC) is designed as a bus system with an integrated transmission of a voltage supply and signals for the purge group controller (PGC).

7. Device according to claim 5, characterized in that a bus system is a controller area network (CAN) bus system.

8. Device according to claim 1, characterized in that the purge bay controller (PBC) automatically handles a normal operation of the device in a program-controlled manner.

9. Device according to claim 1, characterized in that the device is designed to the effect that status information of an overall device is collected by the purge manager host and made available to the operator and or other facilities in a semiconductor chip factory.

* * * * *